United States Patent [19]

Woerlee et al.

[11] Patent Number: 4,590,093

[45] Date of Patent: May 20, 1986

[54] METHOD OF MANUFACTURING A PATTERN OF CONDUCTIVE MATERIAL

[75] Inventors: Pierre H. Woerlee; Johannes F. C. M. Verhoeven, both of Eindhoven, Netherlands

[73] Assignee: U.S. Philips Corporation, New York, N.Y.

[21] Appl. No.: 658,108

[22] Filed: Oct. 5, 1984

[30] Foreign Application Priority Data

Oct. 10, 1983 [NL] Netherlands ............... 8303467

[51] Int. Cl.⁴ ............... H01L 21/02; H01L 21/28
[52] U.S. Cl. ............... 427/79; 427/85; 427/96; 156/628; 156/657
[58] Field of Search ............... 427/79, 85, 96; 156/628, 657

[56] References Cited

FOREIGN PATENT DOCUMENTS 0052038 5/1982 European Pat. Off. .

Primary Examiner—Richard Bueker
Attorney, Agent, or Firm—Paul R. Miller

[57] ABSTRACT

A method of providing narrow conductor tracks of metal silicide is provided. According to this technique, a pattern of polycrystalline silicon covered by a protective layer is converted along the edges into the silicide by covering the device with a metal. The edges are then silicidized laterally over a distance of 20 to 500 nm. The remaining silicon is selectively removed, and the tracks obtained can serve as conductor masks, such as, for example, a plate of a capacitor.

11 Claims, 10 Drawing Figures

METHOD OF MANUFACTURING A PATTERN OF CONDUCTIVE MATERIAL

The invention relates to a method of manufacturing a pattern of conductive material, in which a substrate is covered at least in part by a layer of silicon, after which the layer is converted at least along a part of its edge into the conductive material and the remaining part of the layer is removed by means of a selective removal treatment.

The invention further relates to a substrate provided with a conductive pattern manufactured by the use of the method.

Such a pattern may act in an integrated circuit as a conductor pattern, but may also act as a mask. In the manufacture of a MOSFET, a conductor strip may serve, for example, as an implantation mask for providing the source and drain zones in a self-registering manner. The conductor strip belonging to such a conductor pattern then generally acts at the same time as a gate electrode.

With the advance in technology for manufacturing integrated circuits, increasingly more stringent requirements are imposed on the packing density of the component electronic circuit elements (transistors, resistors etc.), as a result of which increasingly smaller dimensions of the separate constructional elements of the circuit are aimed at. The lower limit of the dimensions attainable by means of photolithographic techniques is approached more and more closely.

A method of the kind described in the opening paragraph, with which track widths of 200–500 nm can be realized in the pattern of conductive material, is known from the European Patent Application No. 0052038 laid open to public inspection on May 19, 1982. To accomplish this, the edge of a layer of polycrystalline silicon is laterally doped with impurities by diffusion, as a result of which a strip of highly doped good conducting polycrystalline silicon is obtained along this edge. The remaining parts are then removed by selective etching, the strip of polycrystalline silicon left behind forming part of the conductor pattern and serving in a next step as an etching mask.

The doping of the layer of polycrystalline silicon requires a good process control because the diffusion of impurities takes place very rapidly, notably along grain boundaries. As a result, the diffusion does not take place over a uniform distance so that after selectively etching, the polycrystalline silicon along the edge of the remaining strip does not exhibit a uniform structure.

A further disadvantage of the use of polycrystalline semiconductor tracks as conductor tracks in integrated circuits is their electrical resistance, especially when increasingly narrower conductor tracks should be used. In the European Patent Application, a conductor track is shown in which the disadvantage is obviated in that the conductor track is constructed as a double layer (polycrystalline silicon covered with a metal silicide), but by this measure the width of the conductor track is not reduced.

The invention has inter alia for its object to provide a method in which very narrow tracks (down to the order of 50 nm) can be realized, which nevertheless have a high electrical conductivity.

A method according to the invention is characterized in that the conductive material comprises a metal silicide.

It is based on the recognition of the fact that, when the silicon layer is converted from the edge into silicide, very narrow conductor tracks of good conducting material can be obtained, while the remaining part of the silicon layer can be etched selectively with respect to these conductor tracks. The narrow silicide tracks can be grown accurately in that the process of silicidation is very accurately controllable.

For example in the case of platinum silicide, the width of such tracks is directly coupled with the thickness of a platinum layer which can be accurately controlled. Moreover, the conversion into silicide can take place at a comparatively low temperature (approximately 450° C.).

By means of the method according to the invention, conductor tracks can be manufactured which are about a factor 5 narrower (of the order of 50 nm) than those manufactured by means of the method according to the European Patent Application No. 0,052,038. As a result, the packing density of integrated circuits can be considerably increased on the one hand due to the fact that narrower conductor tracks are realized and on the other hand due to the fact that, while using such narrow tracks as a mask, smaller components, for example insulated field effect transistors, can be manufactured.

A first preferred embodiment of a method according to the invention is therefore characterized in that the substrate comprises a semiconductor body in which there are formed in a surface zone of a first conductivity type surface zones of a second conductivity type opposite to the first conductivity type in that, using the conductor track of metal silicide as a mask, the impurities causing the second conductivity type are provided in the semiconductor body for forming the surface zones.

A MOS transistor manufactured by means of this method has a very short channel length and can be manufactured by means of a self-registering ion implantation, while moreover there are the advantages of a good conducting gate electrode, such as a low voltage drop and a short RC time.

Furthermore, metal patterns formed in accordance with the invention can be provided with a thin layer of dielectric material on which a second metal layer, for example of aluminium, can be provided for obtaining a capacitance. Thus, integrated capacitors having a higher capacitance value per unit surface area can be manufactured.

A few embodiments of the invention will now be described by way of Example more fully with reference to the drawings, in which:

FIG. 8 shows in cross-section another device which is manufactured by means of a method in accordance with the invention, while

Figure 1:
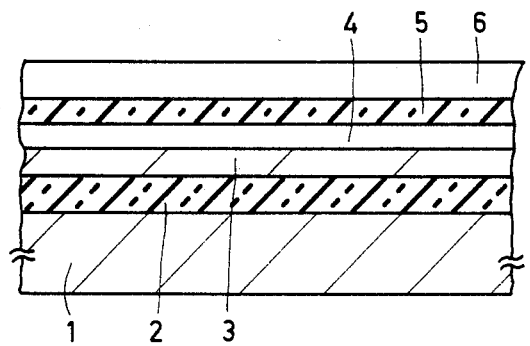
FIGS. 1 to 6 show in cross-section the manufacture of a narrow conductive track by means of a method in accordance with the invention.

The Figures are schematic and not drawn to scale, while for the sake of clarity in the cross-sections notably the dimensions in the direction of thickness are greatly exaggerated. Semiconductor zones of the same conductivity type are generally cross-hatched in the same direction; in the Figures corresponding parts are generally designated by the same reference numerals.

FIG. 1 shows a substrate 1 which in the present example is a p-type conducting semiconductor body, but may alternatively be composed of an n-type semiconductor body on which a p-type layer is grown expitaxially. There is disposed on the semiconductor body a silicon oxide layer 2 which, depending upon the device to be manufactured, may locally have different thickness. In the present example, the oxide 2 has, for example, a thickness of 100 nm so that it can serve as the gate oxide of a field effect transistor. The oxide layer 2 is successively covered by a polycrystalline silicon layer 3 having a thickness of approximately 150 nm, a silicon nitride layer 4 having a thickness of approximately 100 nm, a second oxide layer 5 and a photolacquer layer 6 (see FIG. 1).

Figure 2:
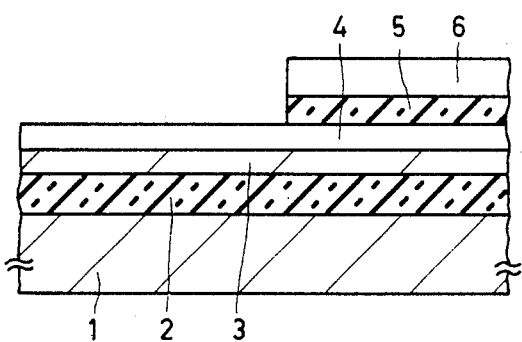

The photolacquer layer 6 is patterned photolithographically, after which the oxide layer 5 is etched, for example in buffered hydrofluoride, using the photolacquer layer as a mask. The photolacquer layer is then removed (FIG. 2).

Figure 3:
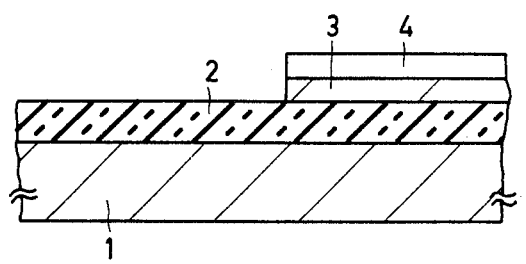
Figure 4:
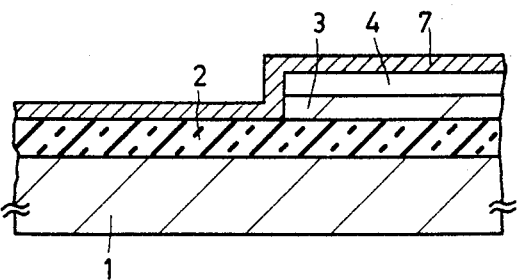

Using the structured oxide layer 5 as a mask, the nitride layer 4 is then patterned, for example by means of generally known wet-chemical etching techniques or by plasma etching. Subsequently, the remaining part of the oxide layer 5 is also removed, after which, using the nitride layer 4 as a mask, the polycrystalline silicon layer 3 is etched anisotropically by means of plasma etching in a chlorine-containing plasma. Thus, the structure shown in FIG. 3 is obtained. This structure is covered by a layer 7 of a metal which forms a silicide with the silicon. Preferably, a layer of platinum having a thickness of 50 nm is used for this purpose, which is applied by sputtering (see FIG. 4). When heated to approximately 450° C., the platinum reacts with the polycrystalline silicon 3 and forms along the edges of the polycrystalline silicon a rim of platinum silicide. The platinum at the edges is then converted completely into platinum silicide, which results in a strip of silicide having a width equal to twice the thickness of the original platinum layer so that tracks having a width of approximately 100 nm can be formed in an accurate and reproducible manner.

Figure 5:
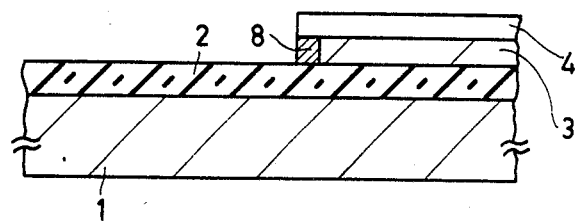

In order to be able to selectively remove the platinum silicide formed with respect to the platinum, this silicide is lightly oxidized. The platinum not converted into silicide is then dissolved in aqua regia (FIG. 5).

Figure 6:
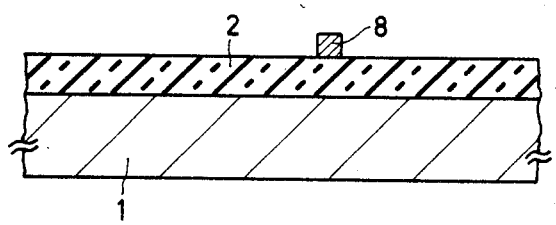

After the conductor track 8 or a pattern of such tracks has been provided, the remaining nitride 4 is removed, for example in an etching bath comprising 80% of boiling phosphoric acid. The remaining polycrystalline silicon 3 is then removed by etching in a mixture of hydrofluoride and nitric acid or in hydroxide or by means of plasma etching. Thus, the device in FIG. 6 is obtained.

In the present example, the conducting strip 8 thus obtained serves as a gate electrode of a field effect transistor having a very short channel length. For this purpose, using the strip 8 as a mask, the n-type source zone 10 and drain zone 11 are provided in a self-registering manner by means of ion implantation. For this purpose, for example, phosphorus ions are implanted into the substrate 2 at a dose of $2.10^{15}$ atoms/cm$^2$ and an energy of 100 keV. A non-critical mask determines the other boundaries of the zones 9 and 10, which are further provided at a later stage with contact metallizations in a generally known manner. If required, also the gate electrode is provided outside the plane of the drawing with a connection to other conductor tracks or an external connection.

Figure 7:
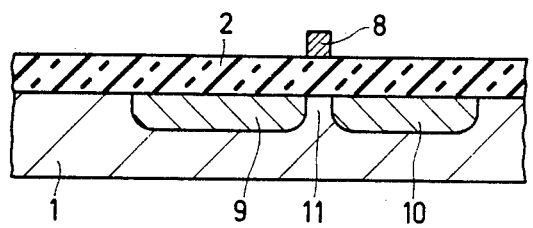
FIG. 7 shows in cross-section an insulated field effect transistor which is manufactured starting from the structure shown in FIG. 6.

The conductor track 8 may also contact outside the plane of the drawing, for example, a p-type contact diffusion which adjoins the surface zone 11 under the track 8. In this case, the device shown in FIG. 7 constitutes a lateral transistor having a very narrow base zone 11 and collector and emitter zones 9 and 10, respectively.

Figure 8:
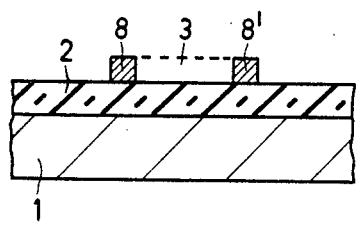

FIG. 8 shows in cross-section a device structure, in which the advantages of the method according to the invention become clearly manifest as compared with photolithographic techniques. In this case, the minimum width of the polycrystalline track 3 indicated diagrammatically is limited by these techniques and is 1 to 2 μm. By means of a method in accordance with the invention, starting from such a track, which is covered by an insulating layer, two conductor tracks 8, 8' of silicide are formed which have a high conductivity and a width of, for example, 0.1 μm. In this manner, a large number of parallel conductor tracks with small interstices can be realized, which may be advantageous, for example, in the manufacture of charge-coupled semiconductor devices (CCD's).

Figure 9:
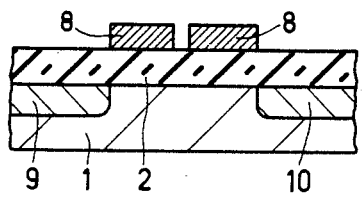
FIG. 9 shows in cross-section a tetrode MOST.

With the use of, for example, electron beam lithography in combination with reactive ion etching, a polycrystalline silicon track 3 can be obtained having a width of approximately 0.6 μm. Starting from such a polycrystalline silicon track, as shown in FIG. 9, for example two electrodes of a tetrode MOST can be provided by means of the techniques described above having a width of, for example, 0.2 μm. The implantation of source and drain zone is then effected using the track 3 as a mask. Otherwise, the reference numerals have the same meanining as in the preceding Figures.

Figure 10:
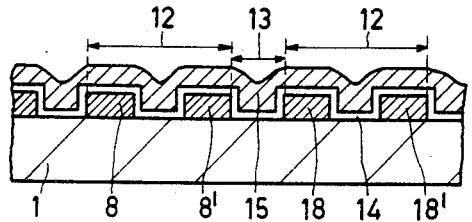
FIG. 10 shows in cross-section a capacitor manufactured by means of a method in accordance with the invention.

FIG. 10 shows a capacitor manufactured on an insulating substrate 1 by means of a method according to the invention. By means of techniques of the kind described in the Netherlands Patent Application No. 810559 of the Applicant laid open to public inspection on July 1, 1983 (notably FIGS. 10-15), polycrystalline silicon tracks can be manufactured having a width of approximately 2 μm, which are separated from each other by grooves of approximately 0.5 μm. The original positions of the tracks and grooves, respectively, are indicated in FIG. 10 by double-arrows 12 and 13. After the silicon tracks, which were originally covered by a thin layer of oxide, according to the invention have been converted along their side edges into silicide, first the oxide and then the remaining silicon are removed. The remaining silicide tracks 8, which are connected to each other outside the plane of the drawing, constitute a first plate of the capacitor. Subsequently, the whole device is covered by a thin dielectric layer 14 of, for example, silicon oxide and a metallization layer 15 constituting the second plate of the capacitor. Thus, the device shown in FIG. 10 is obtained.

The invention is not limited to the embodiments described above. Various modifications are possible for those skilled in the art without depositing from the scope of the invention. For example in the device shown in FIGS. 1 to 7, the conductivity types of the semiconductor zones can be changed (simultaneously). Further, in the device shown in FIG. 10, the dielectric 14 between the tracks 8 may be omitted for the major part.

What is claimed is:

1. A method of manufacturing a pattern of conductive material, in which a substrate is covered at least in part by a silicon layer, after which the silicon layer is converted at least along a part of its edge into conductive material and the remaining part of the silicon layer is removed by means of a selective removal treatment, characterized in that the conductive material comprises a metal silicide.

2. A method as claimed in claim 1, characterized in that the silicon layer is covered by a silicidation-preventing layer and in that, after the silicon covered by the silicidation-preventing layer has been patterned, the device is covered by a metal which forms along the edges of the silicon with the silicon a metal silicide.

3. A method as claimed in claim 1 or 2, characterized in that the silicon is converted into silicide from the edge over a distance of at least 20 nm and at most 500 nm.

4. A method as claimed in claim 3, characterized in the metal silicide is platinum silicide.

5. A method as claimed in claim 4, characterized in that the substrate comprises a semiconductor body, in which surface zones of a second conductivity type are formed in a surface zone of a first conductivity type, and in that, using the conductor track of metal silicide as a mask, impurities causing the second conductivity type are provided for forming said surface zones to obtain source and drain zones of at least a field effect transistor.

6. A method as claimed in claim 3, characterized in that there is provided a number of silicon tracks which are converted along their edges into metal silicide, which forms part of a first plate of a capacitor, after which at least the metal silicide is covered by a layer of dielectric material, which is covered by a metal layer which forms part of the second plate of the capacitor.

7. A method as claimed in claim 6, characterized in that the silicon tracks form parallel strips having a width of at most 2 $\mu$m, which are separated from each other by grooves having a width of at most 1 $\mu$m.

8. A method as claimed in claim 1 or 2, characterized in that the metal silicide is platinum silicide.

9. A method as claimed in claim 1 or 2, characterized in that the substrate comprises a semiconductor body, in which surface zones of a second conductivity type are formed in a surface zone of a first conductivity type, and in that, using the conductor track of metal silicide as a mask, impurities causing the second conductivity type are provided for forming said surface zones to obtain source and drain zones of at least a field effect transistor.

10. A method as claimed in claim 1 or 2, characterized in that there is provided a number of silicon tracks which are converted along their edges into metal silicides, which forms part of a first plate of a capacitor, after which at least the metal silicide is covered by a layer of dielectric material, which is covered by a metal layer which forms part of the second plate of the capacitor.

11. A method as claimed in claim 10, characterized in that the silicon tracks form parallel strips having a width of at most 2 $\mu$m, which are separated from each other by grooves having a width of at most 1 $\mu$m.

* * * * *